US006532526B2

(12) United States Patent
Nizar et al.

(10) Patent No.: US 6,532,526 B2
(45) Date of Patent: *Mar. 11, 2003

(54) METHOD AND APPARATUS FOR CONFIGURING A MEMORY DEVICE AND A MEMORY CHANNEL USING CONFIGURATION SPACE REGISTERS

(75) Inventors: Puthiya K. Nizar, El Dorado Hills, CA (US); William A. Stevens, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/972,647

(22) Filed: Oct. 5, 2001

(65) Prior Publication Data

US 2002/0038412 A1 Mar. 28, 2002

Related U.S. Application Data

(63) Continuation of application No. 09/186,050, filed on Nov. 3, 1998, now Pat. No. 6,378,056.

(51) Int. Cl.[7] .............................................. G06F 12/00
(52) U.S. Cl. ..................... 711/170; 711/160; 711/166; 710/10; 710/74; 710/104; 713/1
(58) Field of Search ................................. 711/160, 166, 711/170; 710/10, 74, 104; 713/1

(56) References Cited

U.S. PATENT DOCUMENTS

| | | | |
|---|---|---|---|
| 4,224,506 A | 9/1980 | Coppola et al. | 377/32 |
| 4,236,207 A | 11/1980 | Rado et al. | 711/166 |
| 4,994,934 A | 2/1991 | Bouhenguel | 361/71 |
| 5,263,168 A | 11/1993 | Toms et al. | 713/1 |
| 5,560,023 A | 9/1996 | Crump et al. | 713/323 |
| 5,713,006 A | 1/1998 | Shigeeda | 711/170 |
| 5,757,365 A | 5/1998 | Ho | 345/272 |
| 6,003,121 A | 12/1999 | Wirt | 711/170 |
| 6,378,056 B2 * | 4/2002 | Nizar et al. | 711/170 |

OTHER PUBLICATIONS

Rambus Advance Information—Direct RAC Data Sheet dated Aug. 7, 1998.
Rambus Advance Information—Direct Rambus RIMM Module 128 Mbytes (64Mx 16/18) date Aug. 20, 1998.
Rambus Advance Information—Direct RMA.d1 Data Sheet date Aug. 7, 1998.
Rambus Advance Information—Direct RDRAM 64/72–Mbit (256Kx16/18x16d) Datasheet.
Rambus Advance Information—RIMM Serial Presence Detect Application Note dated Oct. 9, 1997.

* cited by examiner

Primary Examiner—Do Hyun Yoo
Assistant Examiner—Mehdi Namazi
(74) Attorney, Agent, or Firm—Peter Lam

(57) ABSTRACT

A method and apparatus for configuring memory devices. A disclosed bus controller includes a storage location and a control circuit. The control circuit is coupled to perform an initialization operation when a value indicating that initialization operation is stored in the storage location. The initialization operation is selected from one of a set of initialization operations that the control circuit is capable of performing.

8 Claims, 12 Drawing Sheets

METHOD AND APPARATUS FOR CONFIGURING A MEMORY DEVICE AND A MEMORY CHANNEL USING CONFIGURATION SPACE REGISTERS

RELATED APPLICATIONS

This patent application is a continuation of U.S. patent application Ser. No. 09/186,050, now U.S. Pat. No. 6,378, 056, entitled "A Method And Apparatus For Configuring A Memory Device And A Memory Channel Using Configuration Space Registers", filed Nov. 3, 1998.

This application is related to U.S. Pat. No. 6,173,345, entitled "A Method And Apparatus For Levelizing Transfer Delays For A Channel Of Devices Such As Memory Devices In A Memory Subsystem," U.S. Pat. No. 6,226,729, entitled "A Method And Apparatus For Configuring And Initializing A Memory Device And A Memory Channel," and U.S. Pat. No. 6,230,274, entitled "A Method And Apparatus For Restoring A Memory Device Channel When Exiting A Low Power State," all of which are filed concurrently herewith.

BACKGROUND

1. Field of the Invention

The present disclosure pertains to the field of data processing systems. More particularly, the present disclosure pertains to initializing or configuring a memory devices in a memory channel.

2. Description of Related Art

Memory devices and memory subsystems typically have certain initialization steps and/or register values that need to be programmed prior to normal operation. Recommended steps and values are often detailed in a memory specification provided to system designers who design other system hardware interfacing with the memory devices. Unfortunately, memory specifications may change, and new initialization sequences and/or register values may be desirable.

To implement a new system compliant with a revised specification, expensive hardware changes may be required. Additionally, if more optimal initialization values or sequences are later discovered, they may not be implemented due to the high overhead of making hardware changes. Present systems do not provide a flexible memory initialization technique that may advantageously allow initialization sequences to be altered or optimized after hardware components have been completed.

One channel (i.e., a bus configuration) which requires a significant amount of initialization prior to proper operation is a Rambus™ Direct Rambus Dynamic Random Access Memory Channel (a Direct RDRAM™ Channel). This channel is described in detail in documentation available from Rambus Corporation of Mountain View, Calif. RDRAM memories and memory controllers interfacing with a Rambus channel have various registers that need to be programmed during the initialization process.

One method of initializing a direct RDRAM channel is described in the RMC.d1 Data Sheet, which describes a Direct Rambus™ Memory Controller (RMC). The RMC, however, utilizes an "Init Block" as a part of an application specific integrated circuit (ASIC) to implement initialization procedures (see FIG. 7, p. 16 and p. 72, et seq.). The Init Block is simply activated using two init signals and thereafter performs a routine hard-wired into the Init Block ASIC hardware.

Thus, the prior art in general may not provide an adequate method and apparatus for configuring a set of memory devices. A hard-wired solution such as the RMC ASIC inherently lacks the flexibility to allow rapid alteration of initialization sequences in order to optimize initialization or to contend with a changing memory specification. A flexible memory initialization technique could advantageously be utilized in a Direct Rambus™ bus or in any other memory system requiring significant initialization or configuration.

SUMMARY

A method and apparatus for configuring memory devices is disclosed. A disclosed bus controller includes a storage location and a control circuit. The control circuit is coupled to perform an initialization operation when a value indicating that initialization operation is stored in the storage location. The initialization operation is selected from one of a set of initialization operations that the control circuit is capable of performing.

BRIEF DESCRIPTION OF THE FIGURES

The present invention is illustrated by way of example and not limitation in the figures of the accompanying drawings.

DETAILED DESCRIPTION

The following description provides a method and apparatus for initializing a memory device and a memory channel. In the following description, numerous specific details such as register names, memory types, bus protocols, specific types of components, and logic partitioning and integration choices are set forth in order to provide a more thorough understanding of the present invention. It will be appreciated, however, by one skilled in the art that the invention may be practiced without such specific details. In other instances, control structures and gate level circuits have not been shown in detail in order not to obscure the invention. Those of ordinary skill in the art, with the included descriptions, will be able to implement the necessary logic circuits without undue experimentation.

Using the presently disclosed techniques, efficient and flexible memory initialization may be performed. Control and data registers may be programmed, thereby causing a memory control hub (MCH) to perform initialization operations (IOPs) according the values loaded in the registers. Since the registers may be programmed by software such as a basic input/output system (BIOS), the initialization may be altered with relative ease.

Figure 1:
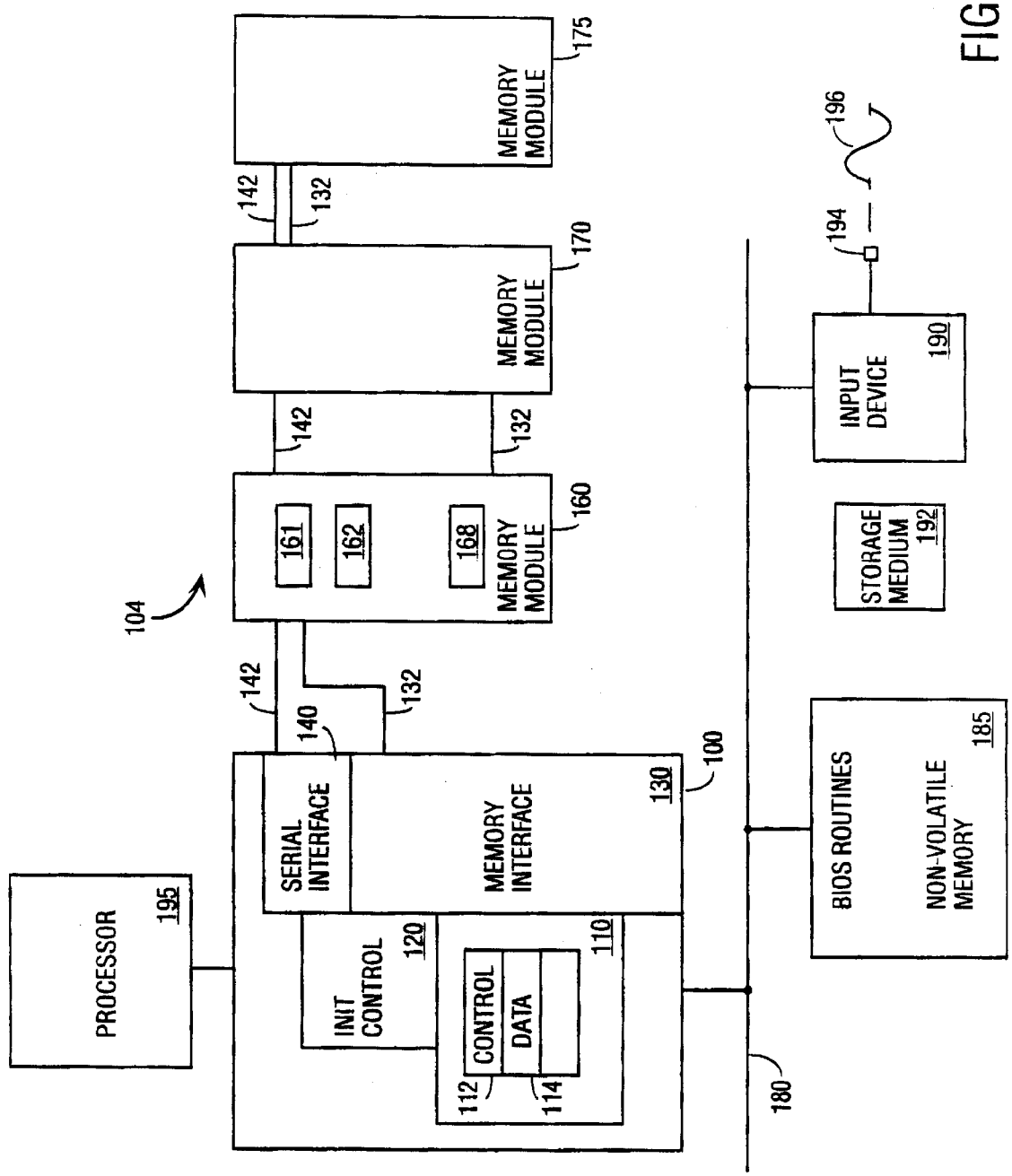
FIG. 1 illustrates one embodiment of a system using configuration registers in a memory controller to designate initialization operations for memory initialization.

FIG. 1 illustrates one embodiment of a system utilizing registers to perform memory initialization. The system includes a processor 195 and a memory subsystem 104 that are coupled to a memory control hub (MCH) 100. Also coupled to the MCH 100 is a secondary bus 180 having coupled thereto an input device 190 and a non-volatile memory 185 containing BIOS routines. In some embodiments, either or both of the non-volatile memory 185 and the input device 190 may be coupled to the MCH 100 by a second control hub (not shown).

In the illustrated embodiment, the memory subsystem 104 includes three memory modules 160, 170, and 175 coupled to the MCH 100 via a serial bus 142 and a memory bus 132 (also referred to as a channel). Each memory module may contain a set of individual memory devices. For example, the memory module 160 includes at least memory devices 160, 161, and 168. In one embodiment, the memory devices 160, 161, and 168 are Rambus DRAMs (RDRAMs), the memory modules are Rambus In-line Memory Modules (RIMMs), and the channel operates according to protocols defined for RIMMs and RDRAMs.

The MCH 100 includes a control register 112 and a data register 114 which may be used for initialization purposes. An initialization control circuit 120 executes initialization operands (IOPs) which are programmed into the control register 112. The control register 112 typically includes other fields to specify information about initialization operations, and some of the operations specified by the IOPs involve data exchange with devices in the memory subsystem (e.g., writing and reading of memory device control registers or otherwise generating control signals).

A serial interface circuit 140 generates serial command and data sequences on the serial bus 142. Some of the commands executed by the initialization control circuit 120 send commands and/or data to the memory subsystem via the serial bus 142. Control registers, including device registers for identification numbers, may be read and written via the serial interface circuit 140.

A memory interface circuit 130 translates memory data to and from data packets which are exchanged with the memory subsystem. In one embodiment, the memory interface circuit is a Rambus ASIC Cell (RAC) functioning substantially as described in the "Direct RAC Data Sheet" available from Rambus Corporation of Mountain View, Calif. Briefly, the RAC converts the Rambus Signal Level (RSL) signals on the channel (bus 132) to signals which can be processed by other portions of the MCH 100. Similarly, the RAC converts the memory controller signals to RSL signal which can be processed by memory devices on the Rambus channel.

Figure 2:
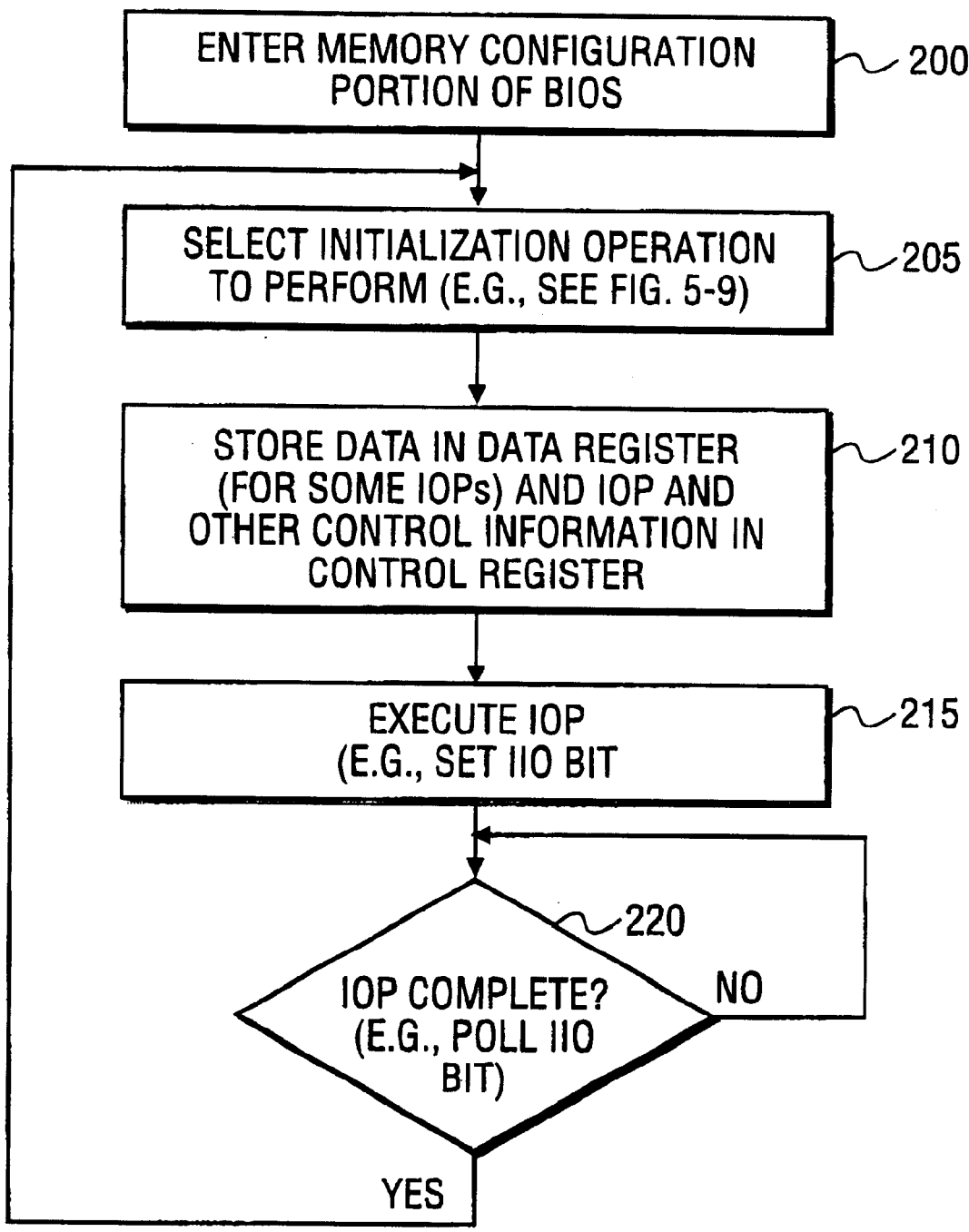
FIG. 2 illustrates a flow diagram of programming and executing initialization operations in one embodiment of the system of FIG. 1.

A sequence of initialization events for the system of FIG. 1 is illustrated in FIG. 2. As the system is reset or turned on, the BIOS typically performs various initialization operations. In block 200, the BIOS reaches the memory configuration portion. Depending on the type of memory and the intended mode of usage, initialization operations will be selected (block 205) by the BIOS in a particular sequence. More details of one embodiment of an initialization sequence for a system utilizing RDRAMs are discussed with respect to FIGS. 5–9.

As indicated in block 210, data (if any) for the particular initialization operation is stored in the data register 114, and the initialization operand itself with other control information is stored in the control register 112. In some embodiments, the BIOS may perform this function by writing to peripheral component interconnect (PCI) configuration registers. Alternatively, other registers may be used, or general purpose memory locations either within or without the MCH may be the control register. In fact, the control register may be any storage location accessible to the MCH prior to memory initialization that is capable of storing sufficient bits for IOPs and any other needed control information.

The initialization operation may commence automatically when the proper initialization operation and/or control information are programmed into the control register 112. For example, the execution of the initialization operation indicated in block 215 may be accomplished by setting an initiate initialization operation (IIO) bit when the initialization operand is loaded into the control register 112. The IIO bit may be a field of the control register 112 so the same register write transaction may set the IIO bit and provide the IOP.

Completion of the initialization operation may be signaled in any manner sufficient to alert or inform the BIOS that the initialization operation is complete. For example, the MCH may automatically clear the IIO bit when the initialization operation completes. If the BIOS polls the IIO bit, it may determine when the initialization operation completes as indicated in block 220. If the initialization operation has not completed, the BIOS may continue polling the IIO bit. If the initialization operation has completed, the BIOS may select the next initialization operation in the initialization sequence in block 205.

The input device 190 may either accept program instructions from a computer storage device 192 (e.g., an optical or magnetic disk or other storage device) or from a network or communications interface 194. BIOS code (i.e., computer instructions) causing the system to implement the disclosed techniques may be programmed into the non-volatile memory 185 in several ways. The BIOS may be programmed when the system is manufactured or may be later delivered via a computer readable medium through the input device 190.

In cases where the BIOS is later delivered, the instructions may be delivered via a computer readable medium. With an appropriate interface device 190, either an electronic signal or a tangible carrier is a computer readable medium. For example, the computer storage device 192 is a computer readable medium in one embodiment. A carrier wave 196 carrying the computer instruction is a computer readable medium in another embodiment. The carrier wave 196 may be modulated or otherwise manipulated to contain instructions that can be decoded by the input device 190 using known or otherwise available communication techniques. In either case, the computer instructions may be delivered via a computer readable medium.

Figure 3:
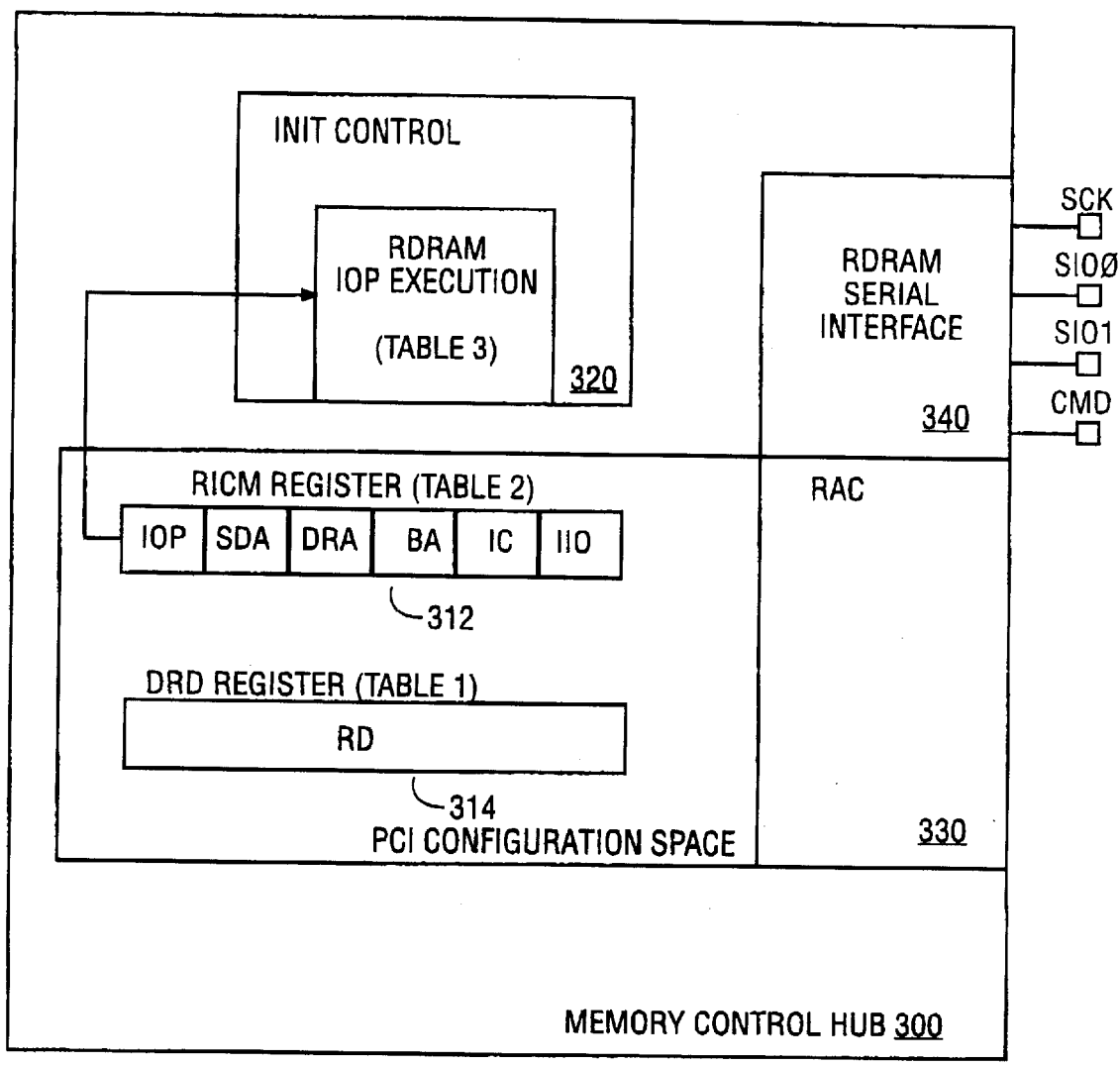
FIG. 3 illustrates one embodiment of a memory control hub that performs memory initialization according to values loaded into control and data registers.

FIG. 3 illustrates additional details of a memory controller hub (MCH) 300. Details of specific register names, locations, sizes, field definitions, and initialization operations are given for one embodiment below. Other embodiments will be apparent to those of skill in the art. Several of the operations below invoke specific commands defined by Rambus in the 64/72-Mbit Data Sheet and the Direct RAC data sheet. These defined operations are operations that the Rambus RAC itself sends to RDRAMs when appropriate control signals are sent to the RAC. As detailed below, this embodiment of the MCH 300 invokes known RAC commands by previously unavailable hardware and in new methods or sequences.

In this exemplary embodiment, the MCH 300 includes a RAC 330 and a serial interface 340. The serial interface 340 uses clock (SCK), serial frame (CMD), and bi-directional serial I/O pins (SIO0 and SIO1) to read and write RDRAM configuration registers as well as to perform other IOPs. The MCH also includes a device register data (DRD) register 314. The DRD register 314 is at address offset 90–91h in PCI configuration space, the default value is 0000h (16 bits), and the register is a read/write register. The fields of the DRD register are shown in Table 1.

TABLE 1

An Embodiment of the DRD Register

| Bit | Description |
| --- | --- |
| 15:0 | Register Data (RD): Bits 15:0 contain the 16 bit data to be written to a RDRAM register or the data read from a RDRAM register as a result of IOP execution. Data will be valid when the IIO bit of RICM register transitions from 1 to 0 |

The MCH 300 also includes a RDRAM Initialization Control Management (RICM) Register 312. The RICM Register is at address offset 94–96h in PCI configuration space, the default value is 000000h (24 bits), and the register is a read/write register. The fields of the RICM register for this embodiment are set forth in Table 2.

TABLE 2

An Embodiment of the RICM Register

| Bit | Description |
| --- | --- |
| 23 | Initiate Initialization Operation (IIO): When set to 1, the execution of the initialization operation specified by the IOP field (below) starts. After the execution is completed, the MCH clears the IIO bit to 0. A software program should check to see if this bit is 0 before writing to it. Data from operations which specify a register data read from the RDRAM will be valid in the DRD register when the IIO bit is cleared to 0. |
| 22:21 | RESERVED: These bits are not used for normal initialization operations. |
| 20 | Initialization Complete (IC): BIOS sets this bit to 1 after initialization of the RDRAM memory array is complete. |
| 19 | Broadcast Address (BA): When BA is set to 1, the initialization operation (IOP) is broadcast to all devices in the channel. When BA is set to 1, the SDA field (below) is not used. |
| 17:9 | Device Register Address (DRA): This field specifies the register address for the register read and write operations. |
| 8:4 | Serial Device/Channel Address (SDA): This 5 bits field specifies the following: the serial device ID of the RDRAM device for RDRAM Register Read, RDRAM Register Write, RDRAM Set Reset, RDRAM Clear Reset and RDRAM Set Fast Clock Mode IOP commands. the device ID for Powerdown Entry, Powerdown Exit, Nap Entry, Nap Exit, Current Calibrate and Current Calibrate & Sample IOP commands. the bank address for Refresh and Precharge IOP commands |
| 18, 3:0 | Initialization Opcode (IOP): This field specifies the initialization operation to be done on a RDRAM device or the MCH RAC.<br><br>Bits[18, 3:0]   Operation Specified<br><br>0 0 0 0 0     RDRAM Register Read<br>0 0 0 0 1     RDRAM Register Write<br>0 0 0 1 0     RDRAM Set Reset<br>0 0 0 1 1     RDRAM Clear Reset<br>0 0 1 0 0     RDRAM Set Fast Clock Mode<br>0 0 1 0 1     Reserved<br>0 0 1 1 0     RDRAM Temperature Calibrate Enable and then Temperature Calibrate<br>0 0 1 1 1 to 0 1 1 1 1 Reserved<br>1 0 0 0 0     RDRAM Core Initialization (RCI)<br>1 0 0 0 1     RDRAM SIO Reset<br>1 0 0 1 0     RDRAM Powerdown Exit<br>1 0 0 1 1     RDRAM Powerdown Entry<br>1 0 1 0 0     RDRAM "Current Cal" and "Current Cal + Sample"<br>1 0 1 0 1     Manual Current Calibration of MCH RAC<br>1 0 1 1 0     Load MCH RAC control register with data from DRD register<br>1 0 1 1 1     Initialize MCH RAC<br>1 1 0 0 0     RDRAM Nap Entry<br>1 1 0 0 1     RDRAM Nap Exit<br>1 1 0 1 0     RDRAM Refresh<br>1 1 0 1 1     RDRAM Precharge<br>All other combinations are reserved.<br>More details on the operations specified by IOP field is shown in Table 3 below. |

Also illustrated in FIG. 3 is an initialization control circuit 320 which includes an RDRAM IOP execution circuit 325. Details of the various IOPs executed by the control circuit 320 are illustrated in Table 3. In Table 3, the broadcast address (BA) field (bit 19) and the SDA field (bits 8:4) are listed either as one of the following:

TABLE 3

IOP Operation Details

| Bits [18, 3:0] | Operation Name | BA | SDA | Details |
|---|---|---|---|---|
| 0 0 0 0 0 | RDRAM Register Read | 0 | x | This IOP performs the serial read of the RDRAM register specified by SDA and DRA fields. The data read will be available in DRD register when the IIO bit is cleared to 0. |
| 0 0 0 0 1 | RDRAM Register Write | x | x | This IOP performs the serial write of the RDRAM register specified by SDA and DRA fields. The write data is provided in the DRD register. A write operation to all RDRAM devices on the channel can be performed by setting the BA field to 1. |
| 0 0 0 1 0 | RDRAM Set Reset | x | x | This IOP performs the serial setting of a reset bit in an RDRAM device specified by the SDA field. The setting of the reset bit begins a period for the RDRAM device to reset and prepare to respond to all other defined operations. The Set Reset IOP also puts the RDRAM in active mode. |
| 0 0 0 1 1 | RDRAM Clear Reset | x | x | This IOP performs the serial clearing of the reset bit in an RDRAM device specified by SDA field. The Clear Reset operation puts the device into Powerdown state. A minimum of 4 SCK cycles must pass after the SIO Request Packet before the RDRAM device is allowed to exit this Powerdown state. The Clear Reset operation may not be issued before greater than 16 SCK cycles have occurred after the Set Reset operation. |
| 0 0 1 0 0 | RDRAM Set Fast Clock Mode | x | x | The Set Fast Clock Mode operation prepares the RDRAM device to transmit and receive data on RSL signals using RDRAM clock (RCLK). |
| 0 0 1 1 0 | RDRAM Temperature Calibrate Enable and then Temperature Calibrate | 1 | x | Upon receiving this IOP, the MCH issues a "Temperature Calibrate Enable" SIO request packet followed immediately by a "Temperature Calibrate" SIO Request packet to all RDRAMs. |
| 1 0 0 0 0 | RDRAM Core Initialization (see FIG. 4) | NE | NE | Upon receiving this IOP command the MCH does the following:<br>1. Broadcast Powerdown Exit.<br>2. Initialize all RDRAM cores of all RDRAM devices on the channel.<br>3. Broadcast Temp Cal Enable and Temp Cal.<br>4. Broadcast NAP entry (if bit 6 (PBS) of DRAMC register is 1).<br>5. If IC bit (bit 20) of RICM register is set to 1 along with this command, then the MCH enables RDRAM Refresh, RDRAM Current Cal, RDRAM Temp Cal, and RDRAM DLL Refresh logic after this command completes. |

TABLE 3-continued

IOP Operation Details

| Bits [18, 3:0] | Operation Name | BA | SDA | Details |
|---|---|---|---|---|
| 1 0 0 0 1 | RDRAM SIO Reset | NE | NE | This IOP sends an SIO pin initialization sequence to all RDRAMs. When this operation occurs the SIO0 pin on the RDRAM is configured as input and SIO1 pin is configured as output. Additionally, the SIO repeater bit is set to 1. |
| 1 0 0 1 0 | RDRAM Powerdown Exit | x | x | Upon receiving this IOP, the MCH initiates a Powerdown exit sequence for the RDRAM device specified by SDA and BA fields. The SDA field should contain the device ID, not the serial device ID. |
| 1 0 0 1 1 | RDRAM Powerdown Entry | x | x | Upon receiving this IOP, the MCH sends a Powerdown Entry PCP packet to the RDRAM device specified by SDA and BA fields. The SDA field should contain the device ID, not the serial device ID. |
| 1 0 1 0 0 | RDRAM "Current Cal" and "Current Cal + Sample" | x | x | Upon receiving this IOP, the MCH sends three Current Calibrate SCP packets followed by one Current Calibrate and Sample SCP packet to the RDRAM device specified by SDA field. |
| 1 0 1 0 1 | Manual Current Calibration of MCH RAC | NE | NE | Upon receiving this IOP, the MCH initiates a manual Current calibration operation of MCH RAC. |
| 1 0 1 1 0 | Load MCH RAC control register with data from DRD register | NE | NE | Upon receiving this IOP, the MCH loads the MCH RAC control register with the data from the DRD register. |
| 1 0 1 1 1 | Initialize MCH RAC | NE | NE | Upon receiving this IOP, the MCH initializes the MCH RAC. The MCH RAC initialization includes Power Up sequence, Current Calibration and Temperature Calibration of the MCH RAC. After executing this command, the MCH enables the periodic Current and Temperature Calibration of the MCH RAC even if the IC bit is not set to 1. |
| 1 1 0 0 0 | RDRAM Nap Entry | x | x | Upon receiving this IOP, the MCH sends a Nap Entry PCP packet to the RDRAM device specified by SDA and BA fields. The SDA field should contain the device ID, not the serial device ID. |
| 1 1 0 0 1 | RDRAM Nap Exit | x | x | Upon receiving this IOP, the MCH initiates a Nap exit sequence for the RDRAM device specified by SDA and BA fields. The SDA field should contain the device ID, not the serial device ID. |
| 1 1 0 1 0 | RDRAM Refresh | 1 | x | Upon receiving this IOP, the MCH sends a Refresh PCP packet to the specified bank of all RDRAM devices. The bank address is specified by SDA field. |
| 1 1 0 1 1 | RDRAM Precharge | 1 | x | Upon receiving this IOP, the MCH sends a Precharge PCP packet to the specified bank of all RDRAM devices. The bank address is specified by SDA field. |

NE: This field has no effect on the initialization operation
0: This field is to be set to 0 for this initialization operation.
1: This field is to be set to 1 for this initialization operation.
x: This field should be programmed as appropriate for the particular initialization operation.

Figure 4:
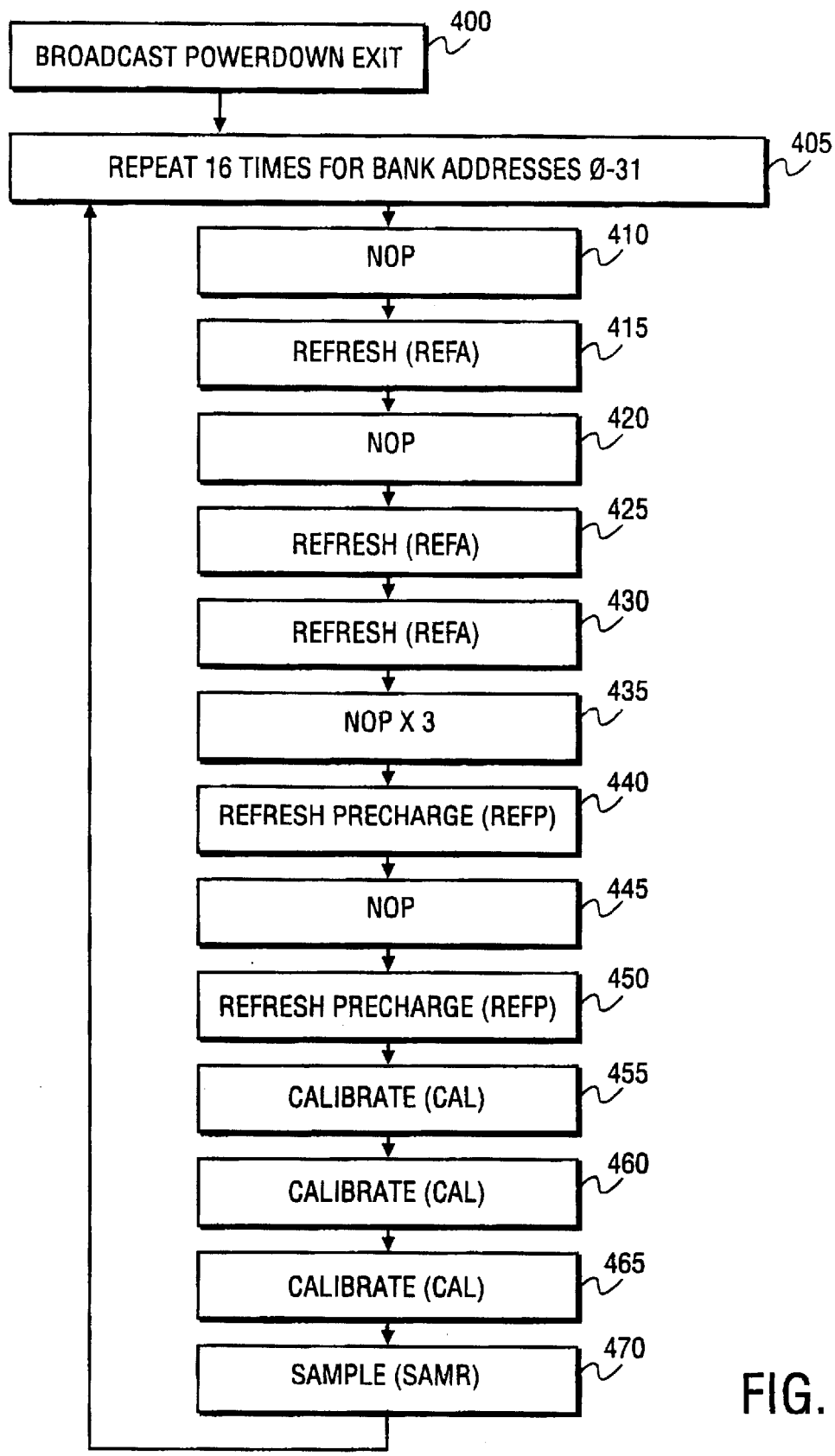
FIG. 4 illustrates a flow diagram for a memory device core initialization operation.

Details of operations conducted by one embodiment of the initialization control circuit 320 in response to receiving the RDRAM Core Initialization IOP (10000b) are shown in FIG. 4. In block 400, a broadcast powerdown exit command is issued on the bus. Next, as per block 405, the sequence indicated by blocks 410 to 470 is repeated sixteen times for bank addresses zero to thirty-one. These numbers may be appropriate for a memory subsystem having one hundred and twenty-eight current calibration levels and up to thirty-two banks. In other embodiments, a different number of repetitions may be used if, for example, a larger or smaller number of current calibration levels are available. Similarly, differing numbers of banks may be available in different systems.

In block 410, no operation is performed to ensure that the powerdown exit is complete and that the refresh operation (REFA command) is properly performed in block 415. In block 420, another no operation command is executed, followed by two more refresh operations (REFA) in blocks 425 and 430. Three more no operation commands are executed in block 435, allowing sufficient time to pass before a refresh precharge (REFP) command occurs. After another no operation command in block 445, another refresh precharge (REFP) command is executed in block 450.

A calibrate (CAL) command is next executed in block 455. This command calibrates (drives) $I_{OL}$ current for the presently indicated device. As indicated in blocks 460 and 465, this operation may be repeated twice. Then, as indicated in block 470, a sample (SAMR) command is executed. The sample command updates the $I_{OL}$ current for the presently indicated device. Until all sixteen repetitions for the thirty-two banks are performed, this process is repeated.

Initialization Sequence

With the above initialization operations, a system may be initialized. For example, the system shown in FIG. 5, which implements a Rambus Direct RDRAM channel, may be initialized. In this system, a memory controller 500 (also referred to as a memory control hub or MCH) orchestrates initialization activities. The memory controller also initiates specific ROW/COLUMN packets on the channel. A serial interface 540 may be used to communicate with devices on the channel. For example, clock (SCK), serial frame (CMD), and bi-directional serial I/O (SIO0 and SIO1) pins may be used to read and write RDRAM configuration registers as well as to perform other IOPs.

The memory controller includes a Rambus ASIC Cell (RAC) 530, a control circuit 520, and a variety of registers. The registers include a initialization registers 515, which are used to initialize the system memory, and powerdown restoration registers 510. The powerdown restoration registers contain timing and other information crucial to operating the memory channel. In other words, the powerdown restoration registers are simply registers that need to be restored after powering down the memory controller 500 in order to resume accesses to the memory channel. The registers may be PCI configuration registers.

The memory channel includes RIMM modules 560, 565, and 570 that are connected to the MCH 500 by a control and data bus 532 and a serial bus 542. The control and data bus 532 may be terminated by a resistive termination 533, and a Direct Rambus Clock Generator (DRCG) 580 may be provided at the far end of the channel from the MCH 500 to provide clock signals over signal lines 582.

Additionally, the system includes an Input/Output control hub (ICH) 505 which couples the MCH to a secondary bus 506 and may contain a second serial interface circuit 544 for interfacing with a second serial bus 546. A serial presence detect (SPD) memory 572 (a non-volatile memory such as an electrically erasable and programmable read only memory) for each module may be read via the serial interface 544 according to a serial presence detect protocol. The SPD memory 572 may provide information such as timing information, device organization, and device technology about each particular memory module. More details of the SPD protocol are discussed in the "Serial Presence Detect Application Brief" as well as the Direct Rambus™ RIMM™ Module and the 64/72 Mbit Direct RDRAM™ data sheets available from Rambus.

In one embodiment, the serial bus 546 is an I2C bus such as a system management bus (SMBus). This embodiment includes clock (SMBCLK) and data (SMBDATA) signals that follow the industry defined System Management Bus (SMBus) protocol as defined in the System Management Bus Specification, Revision 1.0, available from the Smart Battery Implementer's Forum.

The ICH has general purpose outputs (GPOs) which are used to control various system functions such as setting the frequency of the DRCG 580. A non-volatile memory 585 containing the BIOS may be coupled to the secondary bus 506, as well as a battery backed-up random access memory 590. The battery backed-up memory 590 may store powerdown restoration configuration values 592 for the MCH powerdown registers 510 so the MCH can resume accessing the RDRAM channel without performing the full initialization sequence detailed below.

Briefly, the initialization process may be summarized as follows. After power up reset, the configuration information from Serial Presence Detection (SPD) data on the RIMMs in a channel is read. For example, a storage device, SPD memory 572, stores configuration information for the RDRAMs 573, 574, 576, and 577 on the RIMM 570. The memory controller configuration registers are programmed with the appropriate values from the SPD information, and then the RDRAM device IDs are programmed such that each RDRAM device can be uniquely identified and accessed by the memory controller. Once a device has been initialized, it can be used.

Each RDRAM device has two identification numbers that are used to uniquely select a device on the channel, the Serial Device ID, and the Group Device ID. These two IDs are used for distinct operations on the RDRAM channel. The serial device ID is used to select devices when the memory controller is sending initialization operations on the SCK, SIO, and CMD signals of the RDRAM channel. The group device ID is used by the memory controller to select a device when sending ROW packets and COLUMN packets on RQ[7:0] signals of the RDRAM channel. Both the serial device ID and the group device ID are programmed after reset and before devices may be individually addressed by initialization operations (IOPs) and ROW/COLUMN packets, respectively.

Figure 6:
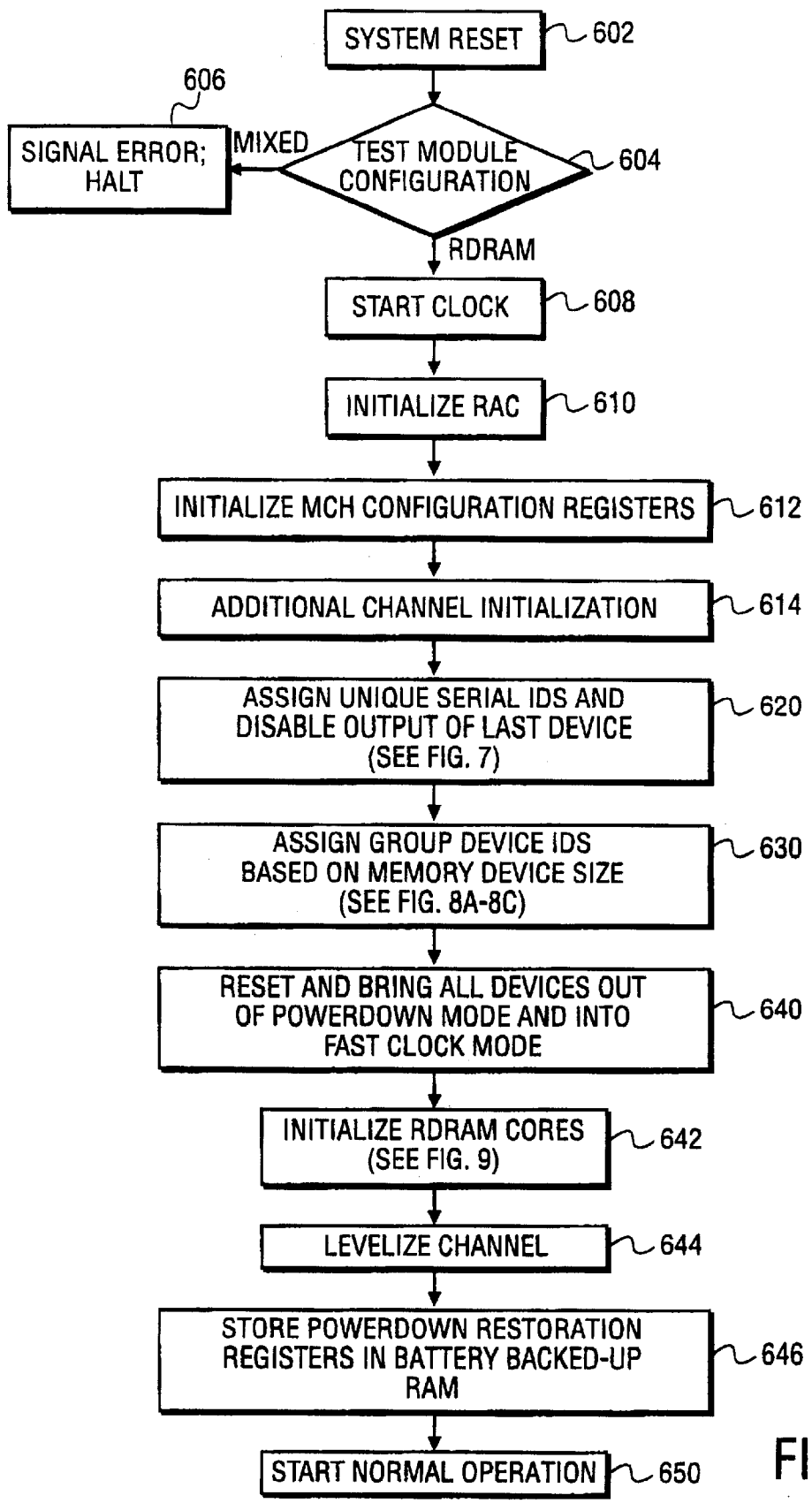
FIG. 6 illustrates a flow diagram of one embodiment of an overall initialization sequence for the memory subsystem of the system shown in FIG. 5.

Looking at the initialization process of the Rambus channel in more detail, a particular sequence may be followed to achieve correct operation of the RDRAM devices on the channel. FIG. 6 illustrates a flow diagram for proper channel initialization in one embodiment, and Table 4 enumerates some of the variables used in this initialization flow.

TABLE 4

Variables Used in Initialization

| Name | Width (bits) | Description |
|---|---|---|
| RIMMMax | 2 | Maximum number of RIMMs present. 0 No RIMMs present 1–3 1–3 RIMM(s) present |
| RIMMCount | 2 | Counter used during initialization to select a RIMM. |
| RIMMDeviceCount | 5 | Number of RDRAM devices in a particular RIMM. |
| MemberMax | 5 | Maximum number of devices present on a channel 0–31 1–32 RDRAM devices present on the channel |
| MemberCount | 5 | Counter used during group device ID enumeration to indicate # of devices that have been assigned group IDs. |
| SerialIDCount | 5 | Serial Device ID index used to select devices on a channel. 0–31 Maps to serial device ID 0–31 |
| GroupDeviceIDCount | 5 | Group Device ID index used during group device ID enumeration to assign a Group Device ID to the next RDRAM device. 0–31 Maps to group device ID 0–31 |
| RIMMDeviceConfigNo | 8 | Byte indicating RDRAM technology definition. Bit definition matches GAR register. |
| DRAMConfigIndex | 3 | Index into table of DRAM technologies supported by MCH Used during group device ID enumeration assign group IDs to RDRAMs in a technology descending order. |
| MchTrdly | 3 | Temporary storage of maximum Mch Trdly during channel levelization procedure. Bit definition matches the MCH's tRDLY field in the MCH RDT register. |
| DeviceTestAddress | 32 | 32-bit CPU address used to test a RDRAM device during channel levelization. |
| TempIndex | 8 | Temporary index used during algorithm. |

In block 602, system reset occurs. The MCH resets all its state machines and prepares for initialization. In block 604, memory module configuration of the system is verified. The BIOS reads SPD data to determine the memory configuration. If only RIMMs are present, the RDRAM initialization sequence may proceed with block 608. If mixed memory modules are present, an error is posted to the user and the system is halted as indicated in 606.

Figure 5:
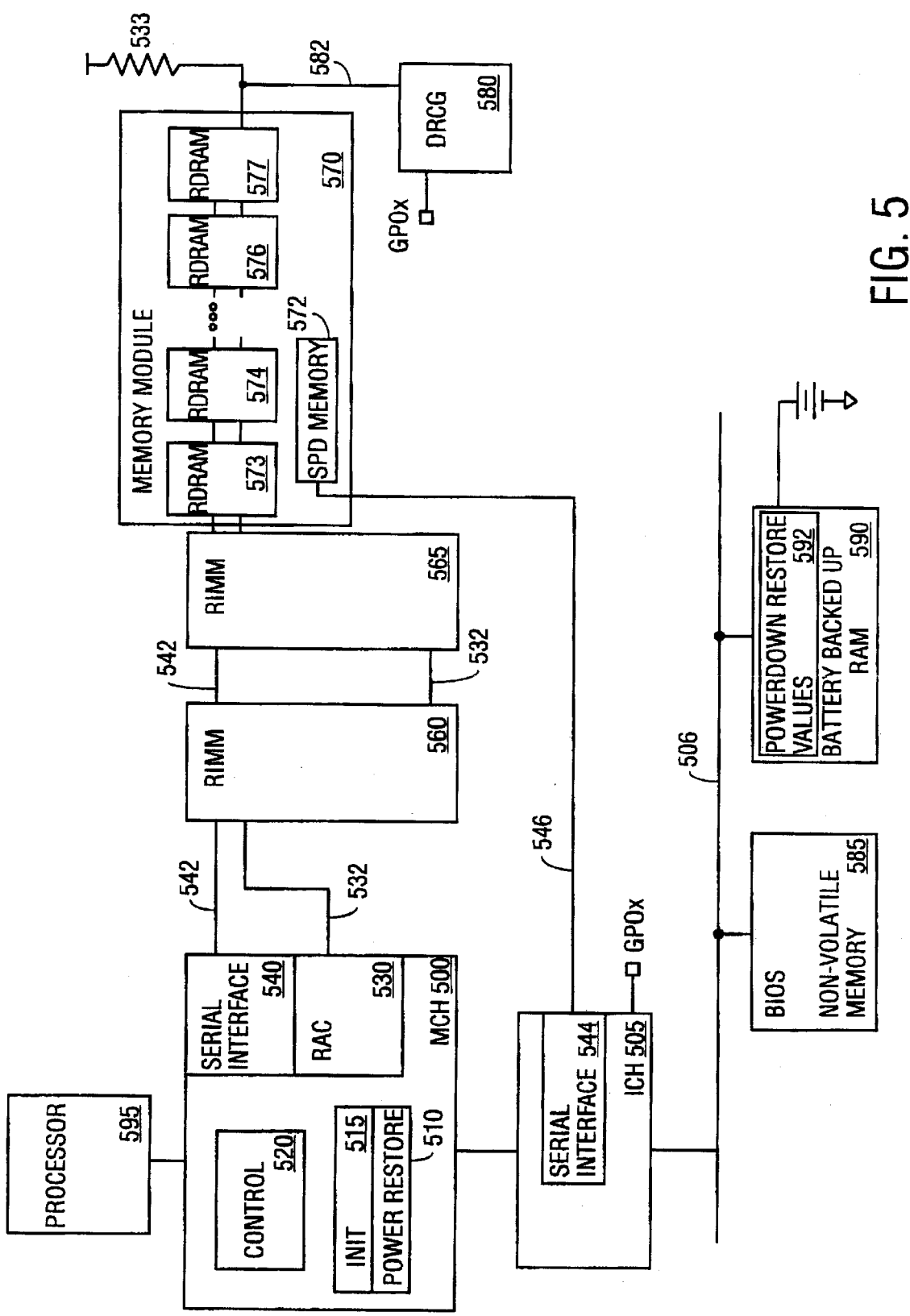
FIG. 5 illustrates one embodiment of a system implementing an initialization flow shown in FIGS. 6–9.

The clock generator is started in block 608. This operation may be accomplished by software querying the SPD data of every RIMM module present on the motherboard and determining a channel frequency at which all RIMMs may operate. The DRCG 580 may be set to the proper frequency by a general purpose output (i.e., GPOx as shown in FIG. 5) from the ICH 505. In one embodiment, the BIOS waits at least 8 ms between this step and the MCH RAC initialization.

As indicated in block 610, the MCH RAC is next initialized. The channel clock from the DRCG should be stable prior to MCH RAC initialization. The MCH RAC initialization is accomplished by executing the MCH RAC initialization IOP. The RAC initialization IOP performs basic initialization to prepare the internal RAC of the memory controller for normal operation.

In one embodiment, the BIOS provides a time out of 5 ms for the IIO bit to clear after the MCH RAC initialization IOP. If the IIO bit is not cleared by the MCH after 5 ms, the BIOS should report the error, and the channel is unusable. An additional 5 ms delay may be added after the MCH clears the IIO bit due to completion of the MCH RAC initialization IOP. This allows sufficient time for the MCH clocks to stabilize and lock. Also in some embodiments, a bus in the RAC may need to be cleared before other operations commence. This may be accomplished by executing the MCH RAC Control Register Load IOP (DRD=00000h). It may also be possible to perform the RAC initialization at a later point in the initialization sequence in some embodiments.

As indicated in block 612, a number of MCH configuration registers may next be initialized. In one embodiment, the paging policy register RMC idle timer (PGPOL RIT) field (MCH 052h [2:0]) is set to 001b to ensure no pages are closed during channel levelization (discussed below). The PGPOL RIT field sets the number of host bus clocks that the memory controller will remain in the idle state before all open pages are closed, and a value of zero indicates that there will be an infinite latency before the memory controller starts closing pages.

Additionally, in some embodiments, operating pools may be used to group RDRAMs based on defined RDRAM states. In order to reduce operating power, the RDRAM devices may be grouped into two operating pools called "Pool A" and "Pool B." In one embodiment, up to eight devices may be in Pool A at a time. In this embodiment, up to four out of eight devices in Pool A may be in Active Read/Write or Active states at a time, and the devices in Pool A are in either Active Read/Write, Active, or Standby states.

The maximum number of devices in Pool A is programmable and is specified by a PAC field of the RDRAM power management register (RPMR) register (MCH 053h). All devices that are not in Pool A are members of Pool B. All devices in Pool B are either in the Standby or Nap state. The state of the devices in Pool B is specified by a PBS field of a DRAM control (DRAMC) register (MCH 051h). In one embodiment, the RPMR register is set to 00h, selecting a pool A of 1 device only, and Pool B operation is set for standby operation (MCH 051h [6]=0).

Next, as indicated in block 614, additional channel initialization may be performed. This may include performing an SIO (serial interface) reset using the SIO reset IOP, and allowing sufficient delay for completion of the SIO reset sequence. Additionally, other registers which may need to be initialized for proper operation may be set at this point. For example, in some embodiments, a Test77 register may need to be written to with a zero value after the SIO reset as specified on page 37 of the Direct RDRAM 64/72 Mbit Data Sheet (execute a Broadcast SIO Register Write IOP: TEST77, DRA=4Dh, DRD=0000h).

Serial Device ID Assignment

As indicated in block 620, serial device identification values (IDs) may be assigned next. In general, the software uniquely identifies each device on the channel to allow initialization operations to be targeted at individual devices. The serial device ID for each RDRAM is stored in the RDRAM INIT register (index 21h) in bits 4-0. After SIO reset, the default value of the serial device ID is 1Fh in all RDRAMs on the channel. Also, after reset, the Serial Repeater (SRP bit (RDRAM 021h [7]) is set to 1, enabling each RDRAM to propagate SIO data received on SIO0 to the RDRAM's SIO1 pin, passing the SIO packet to the next RDRAM device. Since all devices have the same serial device ID after reset, an individual device may not be accessed prior to assigning unique serial IDs.

Figure 7:
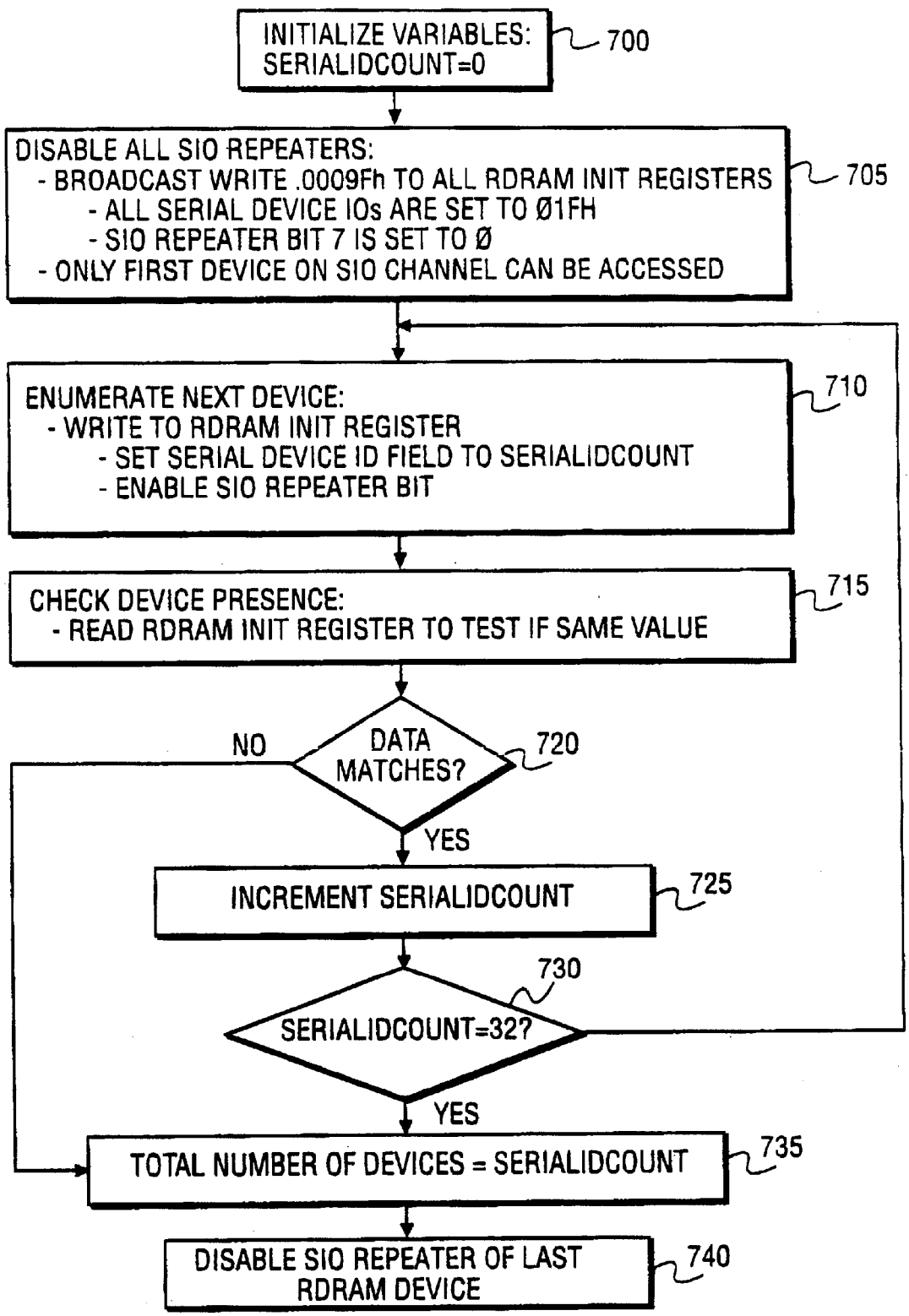
FIG. 7 illustrates one embodiment of a serial device identification process.

Further details of the serial device enumeration performed by one embodiment are shown in FIG. 7. In block 700, the variable SerialIDCount is initialized to zero. Next, as indicated in block 705, the SIO repeaters of all devices on the channel are disabled (Broadcast SIO Register Write IOP. INIT, DRA=21h, DRD=001Fh). This operation causes all serial device IDs to be set to 01fh. The SIO repeater bit is set to zero, so only the first device on the SIO channel can be accessed.

Starting with block 710, the process loops through all devices on the channel and assigns a unique ID to each. The serial ID of the current device is set to SerialIDCount and the SIO repeater bit is enabled (SIO Register Write IOP: INIT, SDCA=1Fh, DRA=21h, DRD=0080h+SerialIDCount). Next, whether the device is actually present and functioning in the system is tested as indicated in block 715. The RDRAM INIT register is read to determine if the same value which was just written is properly read back out (SIO Register Read IOP. INIT, SDCA=SerialIDCount, DRA=21h).

If the data matches (as tested in block 720), serialIDcount is incremented (block 725), and the serialIDCount is checked to see whether a maximum number of devices (e.g., thirty-two) have been given IDs (block 730). If the serialID-Count still indicates a valid serial ID, the next device is identified in block 705.

If the serialIDCount exceeds the maximum permissible value, or if the data did not match in block 720, then the last device has been given an ID, and a variable tracking the total number of devices may be set to the serialIDCount as indicated in block 735. Finally, to disable any additional devices beyond the last permitted device, the SIO repeater of the RDRAM with the highest serial ID is disabled as shown by block 740. Accordingly, any additional devices (i.e., improperly functioning devices or devices beyond the maximum, e.g., thirty-two) do not receive commands and therefore should not respond. As an additional check, the SPD information on the RIMMs may be examined to determine if the final device count is correct.

Group Device ID Assignment

Returning to FIG. 6, after the unique serial IDs have been assigned and the SIO output of the last device disabled, group IDs are assigned based on memory device size as indicated in block 630. In one embodiment, the MCH supports up to thirty-two RDRAM devices and eight groups. Each group has up to four devices and has a group boundary access register (GBA) to define the group ID and the upper and lower addresses for each group. Thus, each GBA register may be programmed with a group ID and a nine bit upper address limit value. Unpopulated groups may have a value equal to the previous group and a group size of zero.

Figure 8A:
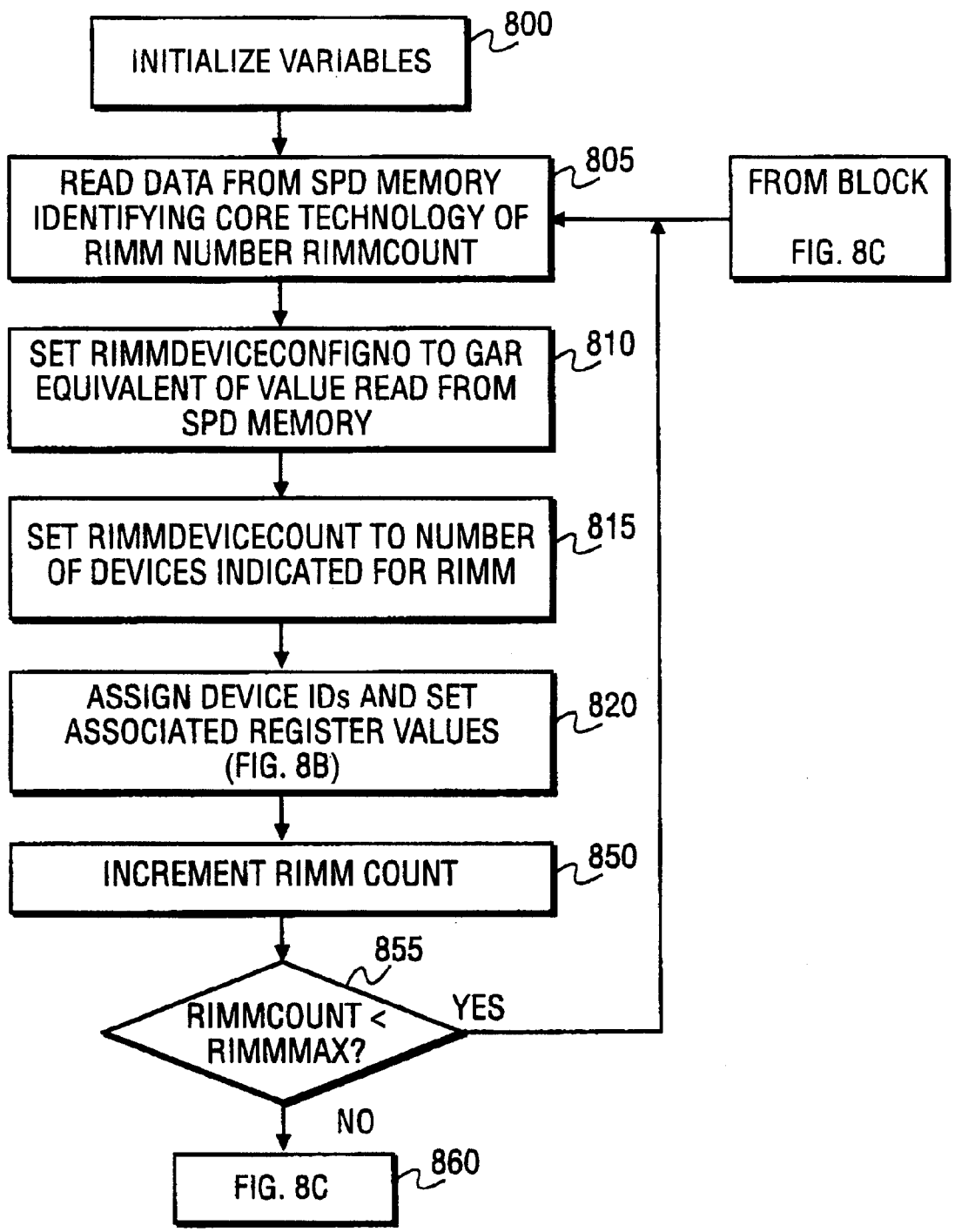
FIG. 8A illustrates one embodiment of a first portion of a group device identification process.
Figure 8B:
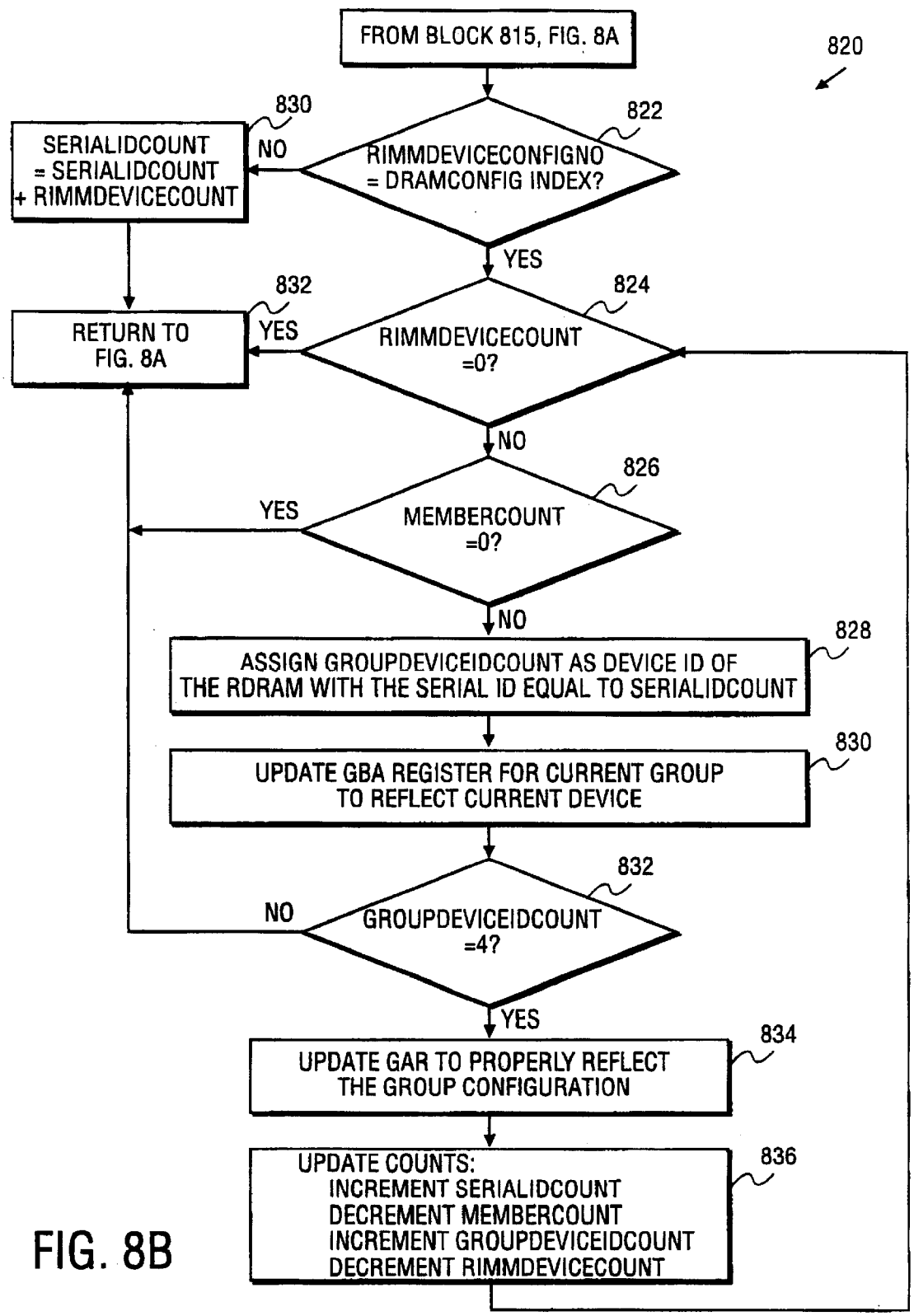
FIG. 8B illustrates one embodiment of a group device assignment process (e.g., block 820 in FIG. 8A).
Figure 8C:
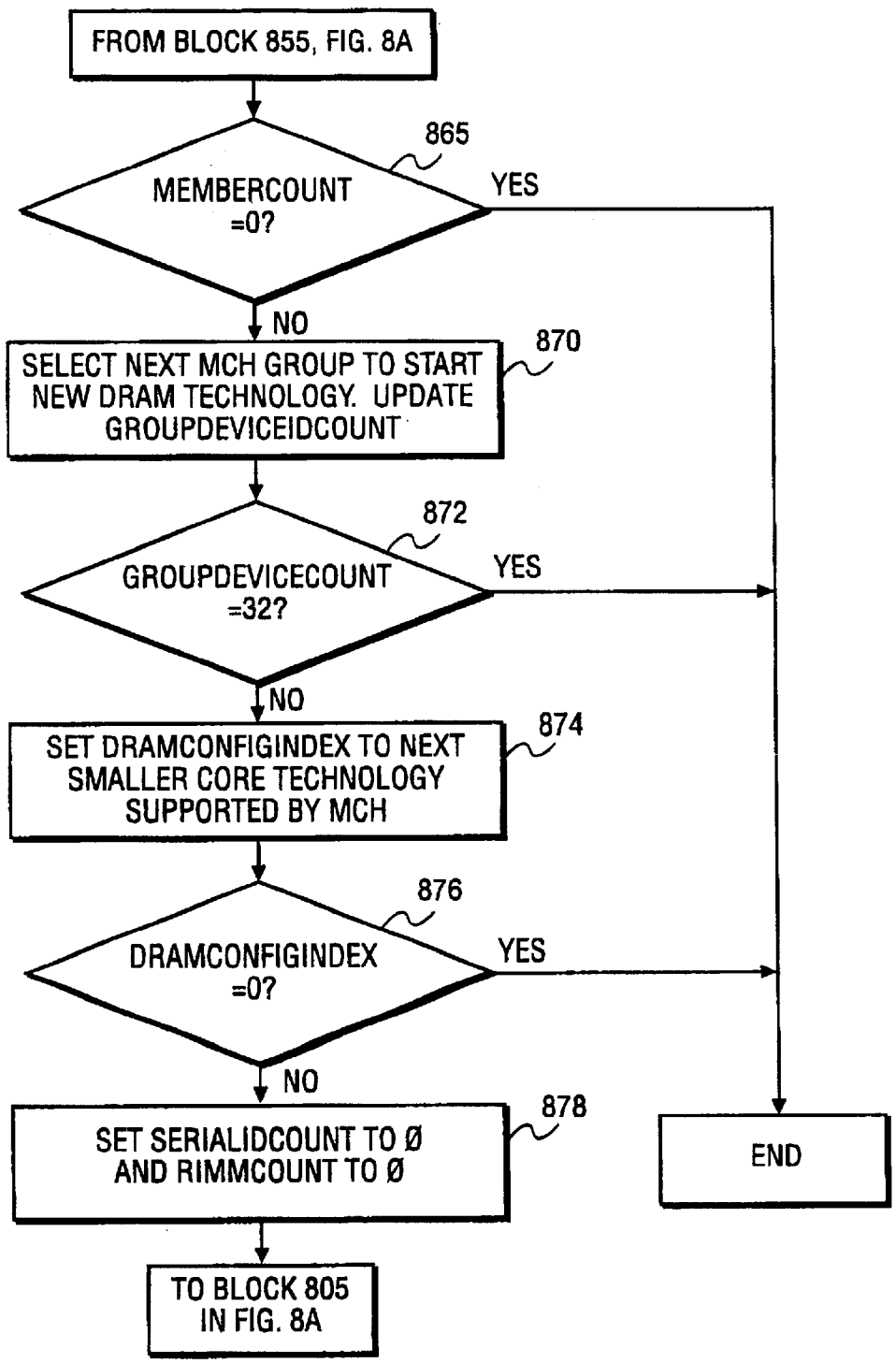
FIG. 8C illustrates one embodiment of a second portion of the group identification process from FIG. 8A.

Additionally, the flowchart in FIGS. 8A–8C illustrates one embodiment of the process of enumerating group device IDs indicated in block 630. As indicated in block 800 in FIG. 8A, a number of variables are initialized. Variables SerialIDCount, GroupDeviceIDCount, RIMMCount, RMMDeviceCount, and RIMMDeviceConfigNo are initialized to zero. A DRAMConfigIndex variable is initialized to a value indicating the largest core technology supported by the MCH.

As indicated in block 805, data is read from the SPD memory of a module (module number RIMMCount) identifying the core technology of that module. This information may include the number of rows per device, the number of columns per device, the number of banks per device, and whether the banks are dependent or independent. Next, as indicated in block 810, the RIMMDeviceConfigNo is set by translating the core technology value read from the SPD into a value in a Group Architecture (GAR) register equivalent value.

Next, as indicated in block 815, the RIMMDeviceCount variable is set to the number of devices indicated by the SPD memory for that RIMM. Thereafter, the device IDs may be assigned and associated register values set as indicated in block 820. Further details of the process indicated in block 820 for one embodiment are shown in FIG. 8B.

In general, the enumeration process adds the number of RDRAM devices on a RIMM to the first Serial ID and then counts down until the RIMM is finished. Therefore, as indicated in block 822, whether RIMMDeviceConfigNo equals the DRAMConfigIndex is tested to determine whether group device IDs have been assigned for all devices in a particular core technology. If they are unequal, all devices for that core technology have group IDs, so the SerialIDCount is set to SerialIDCount plus RIMMDevice-Count (as indicated in block 830) and the process returns to FIG. 8A as indicated in block 832. Additionally, if RIMMDeviceCount is zero (as tested in block 824) or Member-Count is zero (as tested in block 826), there are no more devices to give group IDs and the process returns to FIG. 8A as indicated in block 832.

If RMMDeviceCount and MemberCount are not zero, a GroupDeviceIDCount is assigned to be the group device ID of the RDRAM with the serial ID equal to the present value of SerialIDCount as indicated in block 828. Next, the current group boundary address register (GBA) is updated to reflect the addition of the new device to this group as indicated in block 830. This may be accomplished by adding a value indicative of the device size to the previous value stored in that GBA register.

Next, the GroupDeviceIDCount is compared to four (the maximum number of devices per group in one embodiment) in block 832. If the group is full, the MCH Group Architecture Register (GAR) for that group is updated as indicated in block 834. The GAR is updated to properly indicate the group configuration (i.e., the number of banks and the DRAM technology (size)). In block 836, SerialDevice-IDCount is incremented, MemberCount is decremented, GroupDeviceIDCount is incremented, and RMMDevice-Count is decremented. The process then returns to block 824.

Returning to FIG. 8A, if either RIMMDeviceCount or MemberCount is zero, RIMMCount is incremented as indicated in block 850. If RIMMCount is less than a maximum RIMMCount, as tested in block 855, then the process returns to block 805. If the RIMMCount has reached the last RIMM, the process continues in FIG. 8C as indicated by block 860.

Turning to FIG. 8C, if MemberCount is zero (as tested in block 865), the device ID enumeration process ends. If, however, MemberCount is not zero, the next MCH group is selected to start enumerating the devices in the next DRAM technology as indicated in block 870. GroupDeviceIDCount may be updated by adding three and performing a logical AND operation of the resulting value and 0FFFCh.

If GroupDeviceIDCount is a maximum number devices allowed in the channel (e.g., thirty-two as tested in block 872), then the group ID enumeration process ends. If, however, fewer devices have been given group ID numbers, the DRAMConfigIndex is set to the next smallest core technology supported by the MCH as indicated in block 874. If the DRAMConfigIndex indicates that there are no smaller core technologies supported (e.g., DRAMConfigIndex is zero as tested in block 876), then the ID enumeration process ends. If there are more core technologies, serialIDCount and RIMMCount are reset to zero, as indicated in block 878, and the process returns to block 805 in FIG. 8A.

The psuedo-code below indicates operations that may be used to perform the group ID enumeration indicated by block 630 of FIG. 6 in one embodiment.

630. Enumerate MCH device groups.
    630.1. Loop through RIMM SPD memory and group the devices on the RIMMs. The largest technology devices must be grouped in the lowest groups, with the technology size decreasing as the group #s increase.
        630.1.1. Set MemberCount =MemberMax
        630.1.2. Set SerialIDCount=0. This is the Serial Device ID counter
        630.1.3. Set GroupDeviceIDCount=0. This is the Group Device ID counter
        630.1.4. Set RIMMCount=0. This is the RIMM counter
        630.1.5. Set RIMMDeviceCount=0. This is the counter for the # of devices on a RIMM.
        630.1.6. DRAMConfigIndex=Largest technology supported by MCH
        630.1.7. Compute RIMM #RIMMCount's core technology
            630.1.7.1. RIMMDeviceConfigNo=core technology read from RIMMs SPD.
        630.1.8. RIMMDeviceCount=# of RDRAM devices in RIMM #RIMMCount, read from the RIMM's SPD EEPROM.
        630.1.9. Assign group device IDs and program MCH GAR and GBA registers for RIMM.
            630.1.9.1. If RIMMDeviceConfigNo !=DRAMConfigIndex, break to 630.1.10
            630.1.9.2. If RIMMDeviceCount=0, break to 630.1.10
            630.1.9.3. If MemberCount=0, break to 630.1.10
            630.1.9.4. SIO Register Write IOP. DEVID, SDCA=SerialIDCount, DRA=40h, DRD=GroupDeviceIDCount.
            630.1.9.5. Program MCH GBA[GroupDeviceIDCount SHR 2]=MCH GBA[GroupDeviceIDCount SHR 2-1]+RIMM #RIMMCount device size.
            630.1.9.6. If GroupDeviceIDCount AND 011b=0
                630.1.9.6.1. Program MCH GAR [GroupDeviceIDCount SHR 2]=RIMMDeviceConfigNo
            630.1.9.7. Increment GroupDeviceIDCount
            630.1.9.8. Increment SerialIDCount
            630.1.9.9. Decrement MemberCount
            630.1.9.10. Decrement RIMMDeviceCount
            630.1.9.11. Go to step 630.1.9.2
    630.1.10. Increment RIMMCount
    630.1.11. If RIMMCount<RIMMMax, go to step 630.1.7
    630.1.12. If MemberCount=0 then break to step 10
    630.1.13. Select next group for next RDRAM technology.
        630.1.13.1. GroupDeviceIDCount=(GroupDeviceIDCount+011b) AND 011b
    630.1.14. If GroupDeviceIDCount=32 then break to step 10
    630.1.15. DRAMConfigIndex=next smallest DRAM technology
    630.1.16. If DRAMConfigIndex=0, then break to step 10
    630.1.17. SerialIDCount=0
    630.1.18. RIMMCount=0
    630.1.19. Go to step 630.1.7. This will begin searching the RIMMs for the next smallest RDRAM technology.

Returning to FIG. 6, after the group IDs have been assigned, the individual RDRAM devices may be brought out of powerdown mode and put into fast clock mode for normal operation as indicated in step 640. The individual RDRAM timing registers in the MCH and RDRAMs may be programmed. The REFB and REFR RDRAM control registers may also be initialized (Broadcast SIO Register Write IOP. REFB, DRA=41h, DRD=0000h; Broadcast SIO Register Write IOP. REFR, DRA=42h, DRD=0000h).

The RDRAM devices may be reset by executing a Broadcast Set Reset IOP, followed by an appropriate delay (e.g., 32 us), then executing a Clear Reset IOP, also followed by an appropriate delay (e.g., 4 us) to allow for the reset operation to complete. The RDRAMs are brought out of powerdown by executing a broadcast RDRAM power down exit IOP, and the fast clock mode is entered by executing a broadcast RDRAM Set Fast Clock Mode Initialization IOP.

Figure 9:
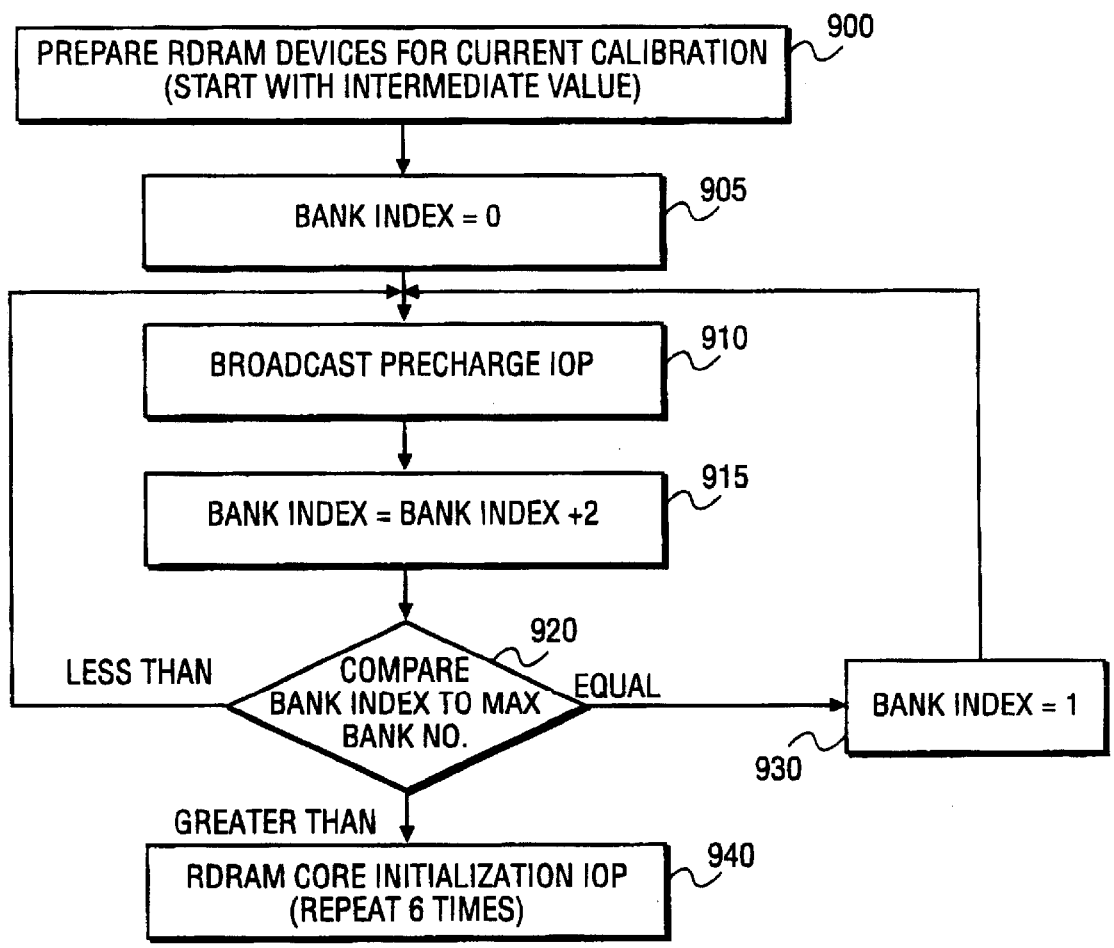
FIG. 9 illustrates one embodiment of a memory device core initialization process.

Thereafter, the RDRAM cores may be initialized as indicated in block 642. Further details of one embodiment of the RDRAM core initialization are shown in FIG. 9. As indicated in block 900, the RDRAM devices are prepared for current calibration by writing an intermediate value to the appropriate RDRAM registers (Broadcast SIO Register Write IOP. CCA, DRA=43h, DRD=0040h; Broadcast SIO Register Write IOP. CCB, DRA=44h, DRD=0040h). Forty hexadecimal may be an appropriate intermediate value in an embodiment that has one hundred and twenty-seven possible current calibration levels. Starting at this intermediate value limits the total number of calibration cycles needed since the calibration value could only be off by approximately half than the full range of calibration values.

Next, precharge operations are performed on each bank of each RDRAM device. To perform the precharge operations, the MCH counts up through the banks by two, first precharging odd banks, and then even ones. A bank index is set to zero in block 905. A broadcast precharge IOP is then executed as indicated in block 910. The bank index value is incremented by two as indicated in block 915, and the broadcast precharge is repeated for even banks until the bank index is found to be equal to a maximum number of banks (e.g., thirty two) in block 920.

Once the maximum number of banks is reached, the bank index is set to one (as indicated in block 930), and all odd banks are precharged. Once the bank index exceeds the maximum number of banks, the RDRAM Core Initialization IOP is executed six times as indicated in block 940.

Channel Levelization

Returning to FIG. 6, after the initialization of the RDRAM cores in block 642, the channel may be levelized as indicated in block 644. This process involves equalizing the sum of the RDRAM read response time and a propagation delay from the RDRAM to the MCH for all RDRAMs. In other words, once the channel is levelized, all RDRAMs will provide data at the memory controller in the same number of bus cycles.

The following psuedo-code indicates a sequence of steps that may be performed in one embodiment to implement the levelization process indicated in block 644.

644. Levelize the Rambus channel
  644.1. Phase 1: Determine MCH tRDLY field value.
    644.1.1. SerialIDCount=MemberMax
    644.1.2. MchTrdly=0
    644.1.3. Program MCH RDT:TRDLY field= MchTrdly.
    644.1.4. Compute the 32 bit address to test the RDRAM device for levelization.
      644.1.4.1. SIO Register Read IOP. DEVID, SDCA=SerialIDCount, DRA=40h
      644.1.4.2. The DRD (MCH 090h [15:0]) now contains the RDRAM's Device ID
      644.1.4.3. DeviceTestAddress=MCH GBA [(DRD SHR 2)-1] SHL 23+((DRD AND 011b) * device size in bytes (from GAR[DRD SHR 2])
    644.1.5. Do QWORD write operation to address DeviceTestAddress with TestPattern.
    644.1.6. Do QWORD read operation to address DeviceTestAddress
    644.1.7. If data read !=TestPattern
      644.1.7.1. Increment MCH RDT:TRDLY field.
      644.1.7.2. If MCH RDT:TRDLY field<=4 then break to step 644.1.5.
    644.1.8. Else (if data read=TestPattern)
      644.1.8.1. MchTrdly=data read from MCH RDT-:TRDLY field
      644.1.8.2. if MchTrdly=4 then break to step 644.2
    644.1.9. Decrement SerialIDCount
    644.1.10. If SerialIDCount>=0 then go to step 644.1.3
  644.2. Phase 2: Determine the RDRAM's levelization timing values
    644.2.1. SerialIDCount=MemberMax
    644.2.2. Compute the 32 bit address to test the RDRAM device for levelization.
      644.2.2.1. SIO Register Read IOP. DEVID, SDCA SerialIDCount, DRA=40h
      644.2.2.2. The DRD (MCH 090h [15:0]) now contains the RDRAM's Device ID
      644.2.2.3. DeviceTestAddress=MCH GBA [(DRD SHR 2)-1] SHL 23+((DRD AND 011b) * device size in bytes (from GAR[DRD SHR 2])
    644.2.3. Do QWORD write operation to address DeviceTestAddress with TestPattern.
    644.2.4. Do QWORD read operation to address DeviceTestAddress
    644.2.5. If data read=TestPattern then break to step 644.2.8
    644.2.6. If TCDLY field of RDRAMs<Max TCDLY (from SPD)
      644.2.6.1. Increment the RDRAMs TCDLY registers (TDAC & TRDLY) according to the TCDLY support table.
    644.2.6.2. Break to step 644.2.3
    644.2.7. Mark the RDRAM device to be disabled.
    644.2.8. Decrement SerialIDCount
    644.2.9. If SerialIDCount>=0 then go to step 644.2.2

After levelization completes, one embodiment stores a number of powerdown recovery memory initialization values in the battery backed-up memory 590 of FIG. 5 as indicated in block 646. Notably, this operation may be performed at any other stage after the appropriate values have been determined by the initialization routine. The values are saved to preserve the initialization information determined by the initialization process to this point.

When a low power state (e.g., suspend-to-RAM) is entered by the system, power to the MCH may be removed. Thus, if the initialization information is not preserved, the entire initialization process may have to be repeated. Storing key initialization information to a non-volatile memory may advantageously speed wake-up from such a low power state. The difficulty of storing such information is increased by the fact that the memory subsystem will not be functional until these values are restored.

Any non-volatile memory which can be written to may be used to store the appropriate initialization information; however, a battery backed-up memory is present in many computer systems and therefore may be a convenient choice. In one embodiment, the registers below are stored in the memory 590.

MCH Group Architecture (GAR) registers (040–047h): These registers indicate device configuration for each group such as the number of banks and the DRAM technology (size).

MCH RDRAM Timing Register RDT (050h): This register defines the timing parameters for all devices in the channel.

MCH DRAM Control (DRAMC) register (051h): This register includes the Pool B Operation Select (PBS) bit, a memory transfer hub presence bit (MTHP), which specifies an operational mode of the MCH, and an Aperture Access Global Enable bit which prevents access to an aperture from any port before the aperture range and translation table are established.

MCH Page Policy (PGPOL) Register (052h): This register specifies paging policy attributes include a DRAM Refresh Rate (DRR) and a RMC Idle Timer (RIT). The DRR field adjusts the DRAM refresh rate and the RIT field determines the number of host bus clock cycles that the memory controller will remain in the idle state before all the open pages are closed.

MCH RPMR (053h): This register includes a Device Napdown Timer (DNT) field, an Active Devices in Pool A (ADPA) field, a Device Napdown Enable (DNE) field, and a Pool A Capacity (PAC) field. The DNT field specifies the number of host clocks the memory controller is idle before the least recently used device in Pool A is pushed out to Pool B. The ADPA field defines the maximum number of RDRAM devices in Pool A that can be in Active Read/Write or Active state at a time. The devices in Pool A that are not in Active Read/Write or Active state are in standby state. The DNE bit (when set to 1) enables the channel inactivity counter to count continuous inactivity time. When the counter value exceeds the threshold specified by DNT, the least recently used device from Pool A is pushed to Pool B. The PAC field defines the maximum number of RDRAM devices that can reside in Pool A at a time. Devices that are not part of Pool A belong to Pool B.

MCH Group Boundary Access (GBA) registers (060–6Fh): The GBA registers contain a group ID and a value indicating the upper address limit for the group.

MCH Configuration Registers MCHCFG (0BE-BFh): These registers contain the Rambus Frequency & DRAM Data Integrity Mode fields.

Also, at this point powerdown configuration options may be programmed. In one embodiment, the self refresh and low power self refresh options are set (for each SerialID-Count: SIO Register Write IOP. INIT, SDCA= SerialIDCount, DRA=21h, DRD=400h (LSR, if SPD supports)+200h (PSR)+80h (SRP)).

Normal operation may start, as indicated in block 650, after a few more registers are programmed for normal operation. The page policy register is set to operate normally (PGPOL RIT field (MCH 052h [2:0]) to 001b) since the page closing timer was effectively disabled for levelizing, and the power management features are enabled at this point via the RPMR register (MCH 053h). If the Pool B Select bit (MCH 051h [6]) is configured for NAP operation, a broadcast NAP entry IOP may be executed to put all devices to the NAP state. In the same I/O instruction that sets the IIO bit, set the IC bit in RICM also to one so that normal operations of the MCH may commence.

Restoring the Channel when Exiting a Low Power State

Figure 10:
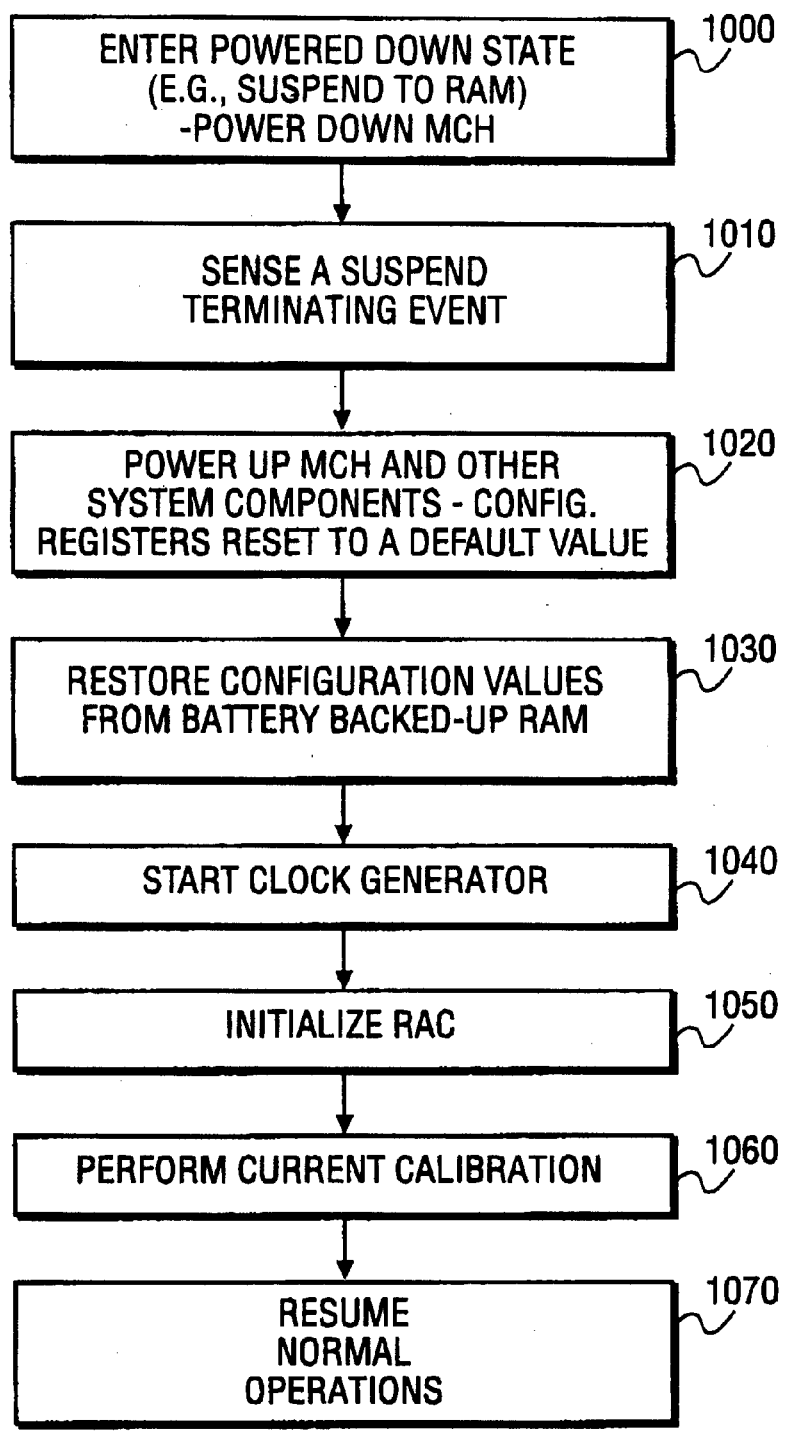
FIG. 10 illustrates one embodiment of the process of returning from a suspend-to-RAM power management state.

After normal operation continues for some time, the system may enter a low power state due to system inactivity or for another reason, as indicated in block 1000 of FIG. 10. One state which the system may enter is a suspend-to-RAM (STR) state in which the MCH loses values stored in its registers. After entering the STR state, an event which causes the system to exit STR may be sensed as indicated in block 1010. Accordingly, the BIOS powers up the MCH and other system components. The configuration registers of the MCH may be automatically reset to a default value in this process.

Accordingly, to again access memory devices on the memory channel, at least some of the configuration register values are needed. The BIOS may cause the ICH 505 to access the battery backed-up memory 590 and restore the registers listed below (saved in block 646 of FIG. 6).

MCH GAR registers (040–047h)
MCH RDT (050h)
MCH DRAMC (051h)
MCH PGPOL (052h)
MCH RPMR (053h)
MCH GBA registers (060–6Fh)
MCH Configuration Registers MCHCFG (0BE-BFh)

After restoring values to these registers, the MCH can once again access items stored in memory when the STR state was entered, including such items as the processor context if saved. The memory devices perform self-refresh in the STR state so other data is not lost.

Next, the clock generator is started as indicated in block 1040. The proper Rambus channel frequency is read from the MCH MCHCFG register (MCH 0BEh [11], which was restored in block 1030). After the clock is allowed to stabilize, the MCH RAC is initialized as indicated in block 1050. This may be accomplished by executing the MCH RAC Initialization IOP. Additionally, the DRD register may be loaded with 0000h and the MCH RAC control register load IOP executed to initialize a bus in the RAC (as discussed with respect to block 610).

Next, current calibration is performed as indicated in block 1060. This may be performed as discussed with respect to block 642 and FIG. 9. In the final iteration indicated by block 940, however, the IC bit in the RICM register may be set, allowing normal operations to immediately commence once the current calibration has completed. Thus, the resume from STR sequence may be substantially faster than the entire initialization sequence required when the system is first powered up since channel levelization, SPD querying, ID assignment, and a number of other initialization operations may be avoided.

In conclusion, a method and apparatus for initializing a memory device and a memory channel is disclosed. While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art upon studying this disclosure.

What is claimed is:

1. A method comprising:
storing an initialization operand in a first memory controller storage location;
setting an initiate initialization operation field to a first state to cause a memory controller to execute the initialization operand; and
performing a memory intialization operation indicated by the initialization operand, said memory initialization operation being selected from a plurality of predefined memory initialization operations, said plurality comprising:
a RDRAM register read command;
a RDRAM register write command;
a RDRAM set reset command;
a RDRAM clear reset command;
a RDRAM set fast clock mode command;
a RDRAM temperature calibrate enable and then temperature calibrate command;
a RDRAM Core Initialization (RCI) command;
a RDRAM Serial I/O (SIO) reset command;
a RDRAM powerdown exit command;
a RDRAM powerdown entry command;
a RDRAM current calibrate and current calibrate and sample command;
a manual current calibration of memory controller hub (MCH) Rambus ASIC Cell (RAC) command;
a load data from the data register into the MCH RAC control register command;
an initialize MCH RAC command;
a RDRAM nap entry command;
a RDRAM nap exit command;
a RDRAM refresh command; and
a RDRAM precharge command.

2. The method of claim 1 further comprising:
polling a stored value to determine when the initialization operation completes.

3. The method of claim 1 further comprising storing data for the initialization operation in a second memory controller storage location.

4. The method of claim 3 wherein storing the initialization operand in the first memory controller storage location and storing data in the second memory controller storage location each comprise storing a value in a peripheral component interconnect (PCI) configuration space register.

5. The method of claim 4 wherein storing the initialization operand is performed by a basic input output system (BIOS) program.

6. An article comprising a machine readable medium having stored thereon a plurality of instructions which, if executed by a machine, cause the machine to perform:
storing an initialization operand in a first memory controller storage location;
setting an initiate initialization operation field to a first state to cause the initialization operand to be executed; and
executing an initialization operation indicated by the initialization operand on at least one of a plurality of memory devices, said initialization operation being selected from a plurality of predefined initialization operations, said plurality comprising:
a RDRAM register read command;
a RDRAM register write command;
a RDRAM set reset command;
a RDRAM clear reset command;
a RDRAM set fast clock mode command;
a RDRAM temperature calibrate enable and then temperature calibrate command;
a RDRAM Core Initialization (RCI) command;
a RDRAM Serial I/O (SIO) reset command;
a RDRAM powerdown exit command;
a RDRAM powerdown entry command;
a RDRAM current calibrate and current calibrate and sample command;
a manual current calibration of memory controller hub (MCH) Rambus ASIC Cell (RAC) command;
a load data from the data register into the MCH RAC control register command;
an initialize MCH RAC command;
a RDRAM nap entry command;
a RDRAM nap exit command;
a RDRAM refresh command; and
a RDRAM precharge command.

7. The article of claim 6 wherein the machine readable medium is a storage device.

8. The article of claim 6 wherein the machine readable medium is a carrier wave.

* * * * *